United States Patent
Goto et al.

(10) Patent No.: US 7,716,626 B2
(45) Date of Patent: May 11, 2010

(54) METHOD OF DESIGNING A CIRCUIT LAYOUT OF A SEMICONDUCTOR DEVICE

(75) Inventors: Kazuaki Goto, Miyazaki (JP); Reiko Harada, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 127 days.

(21) Appl. No.: 10/811,835

(22) Filed: Mar. 30, 2004

(65) Prior Publication Data

US 2005/0229133 A1    Oct. 13, 2005

(51) Int. Cl.
G06F 17/50 (2006.01)
H03K 17/693 (2006.01)
H03K 19/173 (2006.01)
H03K 19/177 (2006.01)

(52) U.S. Cl. ............... 716/19; 716/1; 716/10; 716/16; 716/17; 326/38; 326/39

(58) Field of Classification Search ............ 716/1, 716/10, 17, 19; 257/734; 326/39; 365/63
See application file for complete search history.

(56) References Cited

U.S. PATENT DOCUMENTS

| | | | |
|---|---|---|---|
| 6,054,872 A | | 4/2000 | Fudanuki et al. |
| 6,093,214 A | * | 7/2000 | Dillon ............... 716/17 |
| 6,197,456 B1 | * | 3/2001 | Aleshin et al. ........ 430/5 |
| 6,446,248 B1 | * | 9/2002 | Solomon et al. ...... 716/17 |
| 6,748,579 B2 | * | 6/2004 | Dillon et al. ......... 716/19 |
| 2005/0093147 A1 | * | 5/2005 | Tu ................. 257/734 |
| 2005/0160394 A1 | * | 7/2005 | Bevis ............... 716/19 |

* cited by examiner

Primary Examiner—Helen Rossoshek
(74) Attorney, Agent, or Firm—Studebaker & Brackett PC; Donald R. Studebaker

(57) ABSTRACT

In a method of designing a circuit layout of a semiconductor integrated circuit, a logic function of the integrated circuit is first designed. Then, a pattern layout of the integrated circuit is designed. The designed pattern layout includes a logic cell area and an open area. Next, a spare underground cell is inserted into the open area. The spare underground cell includes a functional element. A mask layout of the integrated circuit is then designed. The designed mask layout includes the logic cell and the spare underground cell.

9 Claims, 6 Drawing Sheets

METHOD OF DESIGNING A CIRCUIT LAYOUT OF A SEMICONDUCTOR DEVICE

BACKGROUND OF THE INVENTION

The present invention relates to a method of manufacturing a circuit of a semiconductor device, and more particularly, to a method of designing an integrated circuit for a LSI device. The method of designing the integrated circuit is disclosed, for example, U.S. Pat. No. 6,054,872.

When a part of logic in a circuit design is changed after a semiconductor was manufactured, a conductive layer layout should be re-designed and an old conductive pattern layer layout would be replaced with the re-designed one. Such replacement has a following merits in comparison with all layer replacement.
1. A cost of mask re-manufacturing is low.
2. A time of mask re-manufacturing is short.

However, the above method includes many manual operations. Further, a scale of the logic change is small in the above method.

SUMMARY OF THE INVENTION

The present invention may provide a data processing apparatus which can effectively utilize an arithmetic processability and a memory capacity.

In a method of designing a circuit layout of a semiconductor integrated circuit according to the present invention, a logic function of the integrated circuit is first designed. Then, a pattern layout of the integrated circuit is designed. The designed pattern layout includes a logic cell area and an open area. Next, a spare underground cell is inserted into the open area. The spare underground cell includes a functional element. A mask layout of the integrated circuit is then designed. The designed mask layout includes the logic cell and the spare underground cell.

DETAILED DESCRIPTION OF THE INVENTION

Figure 1:
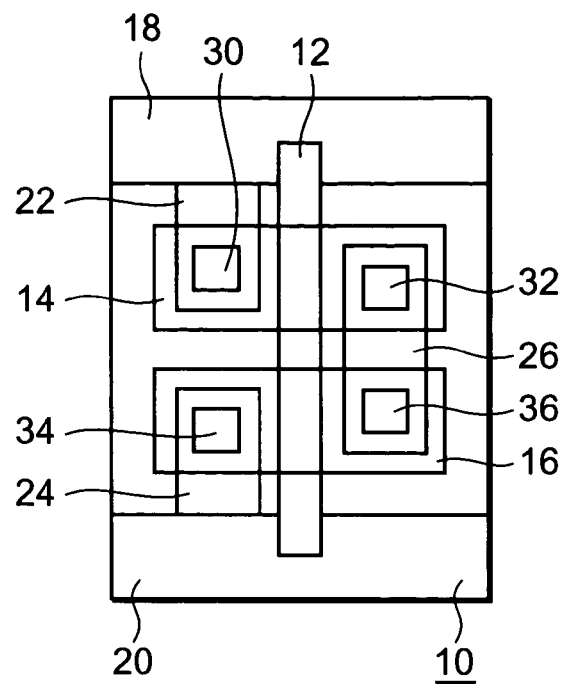
FIG. 1 is a plain view showing a spare cell for an inverter.

Now, an embodiment of the present invention will be described with reference to the drawings. Incidentally, the drawings illustrate the invention merely schematically to the extent that it can be understood. Besides, throughout the drawings, the same reference numerals are assigned to common constituents, which shall not be described repeatedly.

The LSI circuit includes functional circuit cells and spare cells. The spare cells have no functional elements. However, when a part of logic in a circuit design is changed with a single conductive pattern layer layout re-design after a semiconductor device was manufactured, spare cells should be required. The spare cells are included in a logic net list. The net list is used in an automatic pattern layout.

It is hard to estimate a number of the spare cells required for the logic change. If a large number of the spare cells are included in the semiconductor circuit, a layout area of the semiconductor circuit becomes large. In contrast, if a small number of the spare cells are included in the semiconductor circuit, the logic change may not be performed. A number of the spare cells and an ability of the logic change has a tradeoff relationship.

In the present invention, the spare cells are provided in an underground layer.

FIG. 1 is a plain view showing a spare cell for an inverter. The spare cell 10 includes a gate electrode 12, a P type diffusion area 14, an N type diffusion area 16, a Vdd supply conductive pattern 18, a Vss supply conductive pattern 20, interconnect patterns 22, 24 and 26 and contacts 30, 32, 34 and 36. The spare cell 10 works as an inverter cell when the gate electrode 12 and conductive pattern 26 are electrically connected to receive signals.

Figure 2:
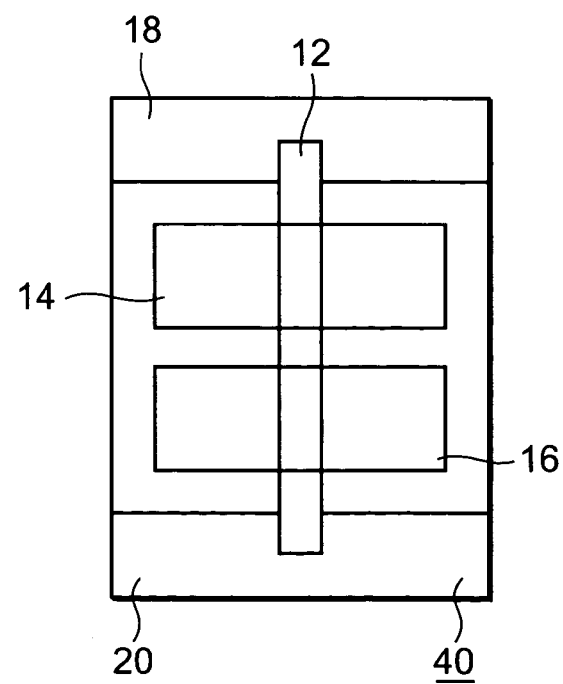
FIG. 2 is a plain view showing a spare underground cell for an inverter.

FIG. 2 is a plain view showing a spare underground cell for an inverter of the present invention. The interconnect patterns and contacts are removed from the spare cells. Therefore, the spare underground cell for the inverter 40 includes the gate electrode 12, the P type diffusion area 14, the N type diffusion area 16, the Vdd supply conductive pattern 18 and the Vss supply conductive pattern 20. In the present embodiment, the spare underground cell for the inverter is disclosed. However, the other spare underground cells can be used for the present invention. For example, a spare underground cell for a transistor, a spare underground cell for a NAND gate, and a spare underground cell for a NOR gate could be applicable for the present invention.

Figure 3:
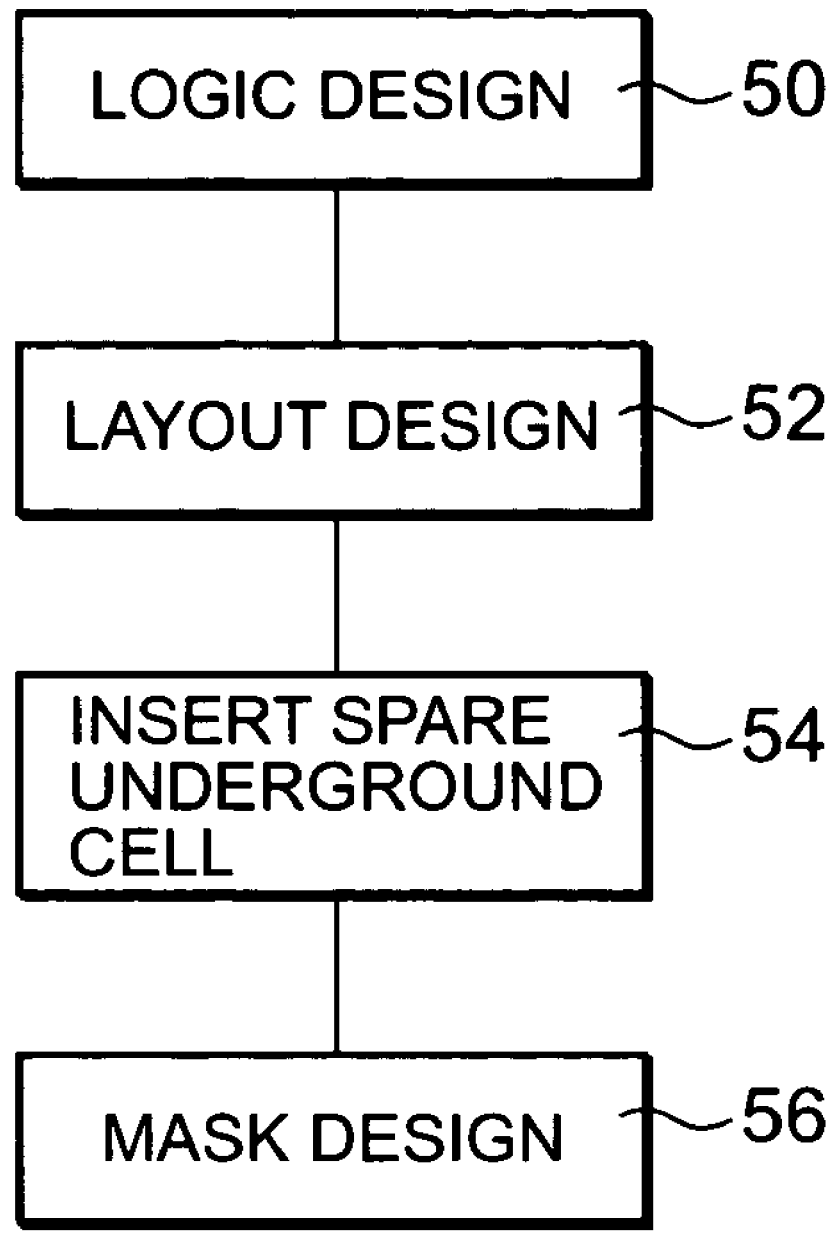
FIG. 3 is a flow chart showing a procedure for inserting the spare underground cell in a LSI design process.

FIG. 3 is a flow chart showing a procedure for inserting the spare underground cell in a LSI design process. First, "LOGIC DESIGN 50" is performed. The logic design means a design for a circuit diagram of a semiconductor device. Next, a pattern layout of the semiconductor device is conducted based on the circuit diagram as "LAYOUT DESIGN 52". The pattern layout includes an open area as mentioned above. Then, the spare underground cell is inserted into the open area of the pattern layout as described "INSERT SPARE UNDERGROUND CELL 54". Since the spare underground cell is inserted into the open area of the pattern layout, the pattern layout is modified. Finally, a photolithographic mask pattern is designed based on the modified pattern layout as "MASK DESIGN 56".

The following table 1 shows a sample list of the spare underground cells.

TABLE 1

| | |
|---|---|
| DFF | 20 |
| INV | 50 |
| NOR | 40 |
| NAND | 40 |
| EOR | 20 |
| LAT | 20 |

In the table 1, symbols of DFF, INV, NOR, NAND, EOR and LAT mean spare underground cells for a D flip-flop, an inverter, a NOR circuit, a NAND circuit an exclusive OR circuit and a latch circuit, respectively. Numbers next to the symbols in the table 1 show how many spare underground cells should be inserted in the pattern layout. Base on the above list, for example, the spare underground cells are disposed on the open area of the pattern layout.

Figure 5:
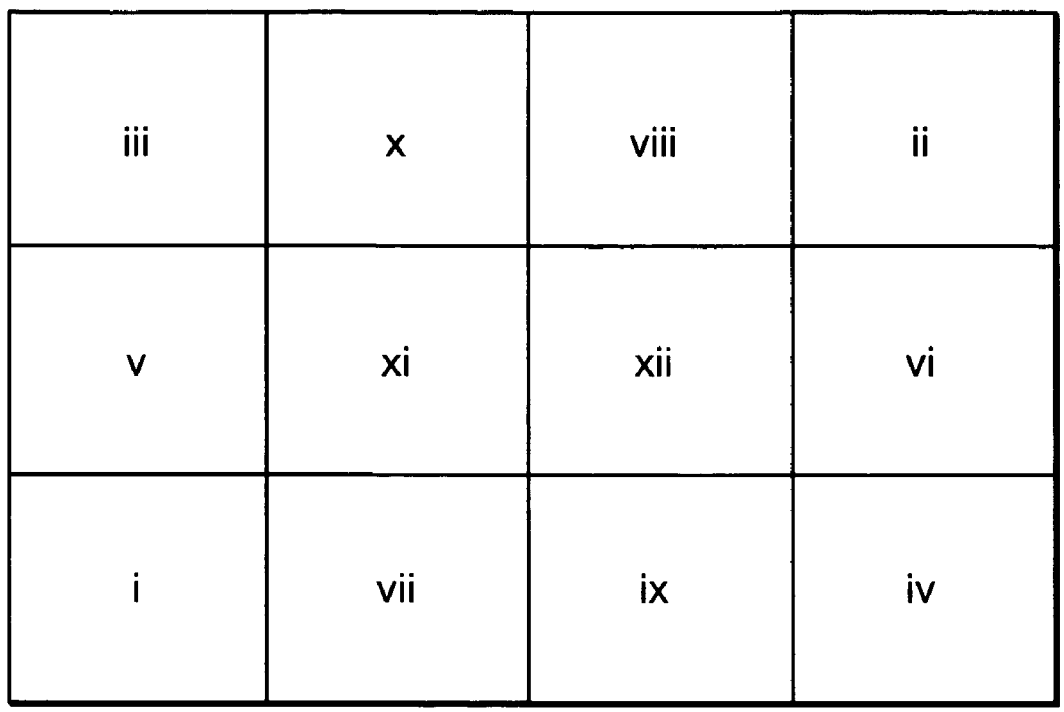
FIG. 5 is a plain view of the pattern layout divided into the block regions.
Figure 6:
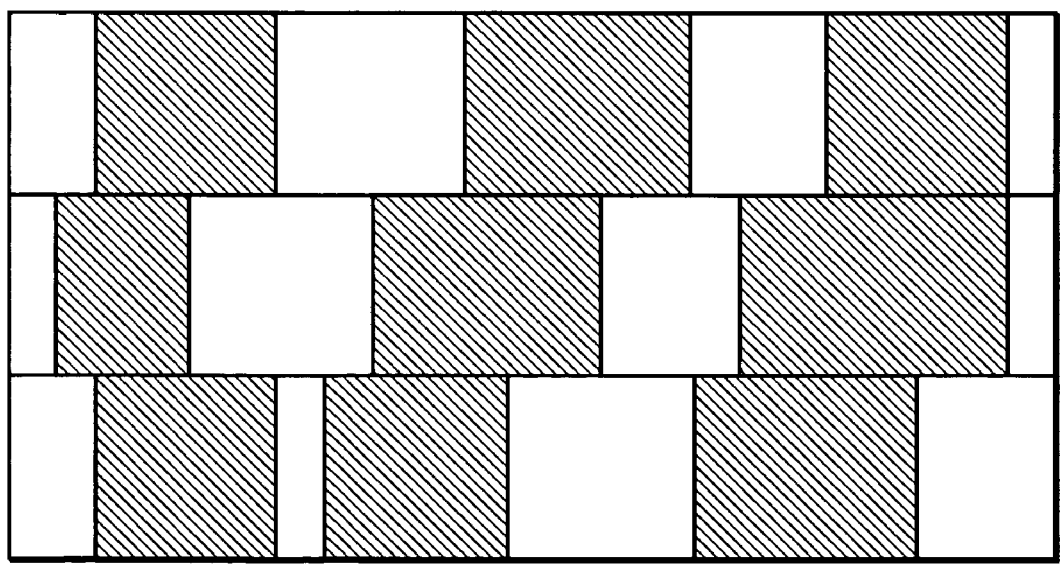
FIG. 6 shows an example of the layout pattern including the open areas and logic cell disposition areas.

Then, a first embodiment of the present invention will be described with reference to FIGS. 4-6.

Figure 4:
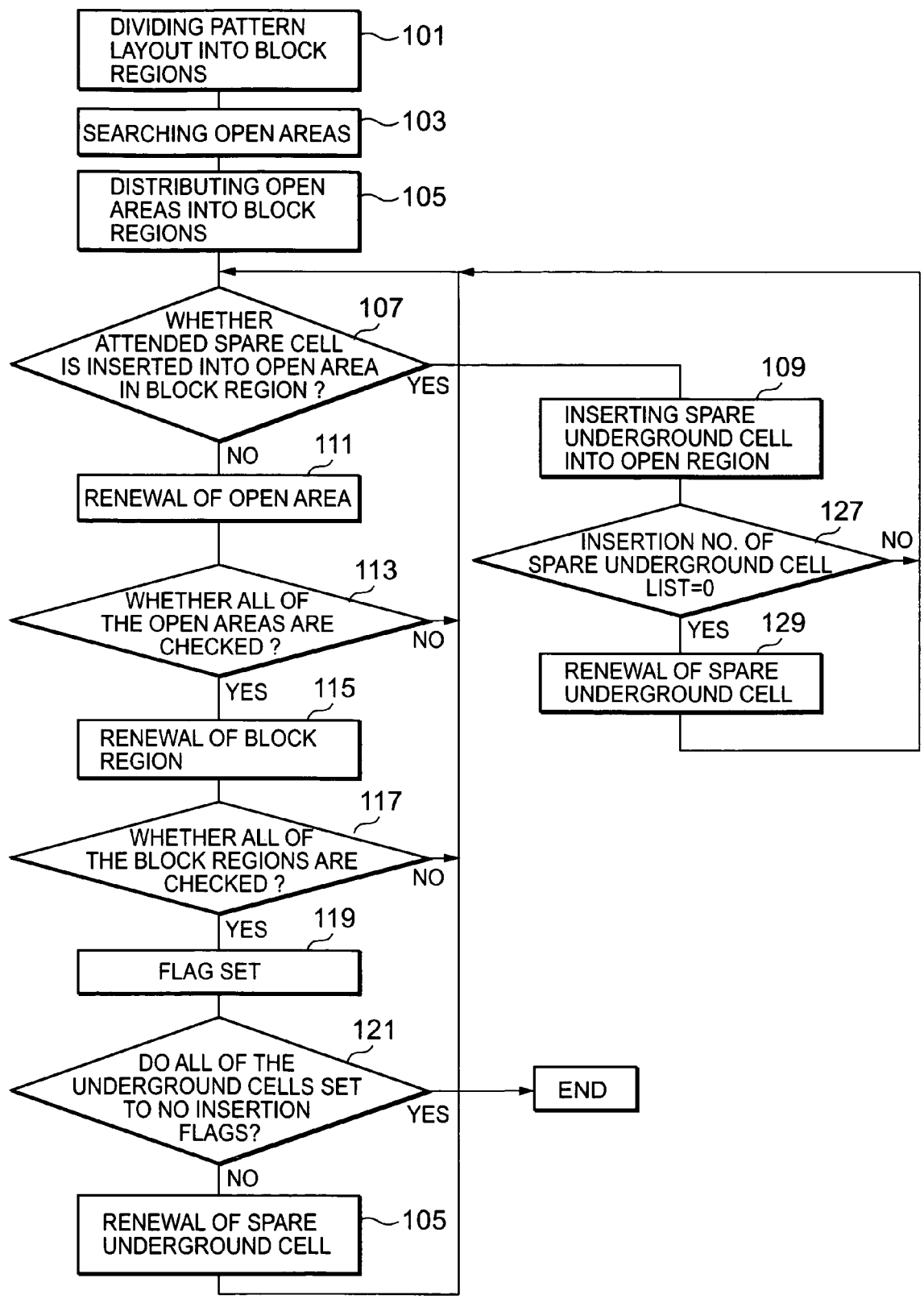
FIG. 4 is a flow chart showing a detailed procedure for inserting the spare underground cell in a LSI design process.

FIG. 4 is a flow chart showing a detailed procedure of the first embodiment of the present invention for inserting the spare underground cell in a LSI design process.

First, a pattern layout is divided into block regions 101. FIG. 5 is a plain view of the pattern layout divided into the block regions i to xii. The block division is for spreading the spare underground cells into every block. A procedure sequence of the blocks are described as roman numerals of the blocks.

Next, an open area is searched within the pattern layout 103. FIG. 6 shows an example of the layout pattern including the open areas and logic cell disposition areas. In FIG. 6, the open areas are shown as white regions and the logic cell disposition areas show are shown as hatched areas.

Then, the open areas are distributed into the block regions 105. The open areas in the block regions are sorted by coordinates X, Y. In this step, some block regions, open areas and spare underground cells are attended. Such attended block regions, attended open areas and attended spare underground cells are set to initial values.

Whether the attended spare underground cell is inserted into the attended open area in a specific block region is checked 107. When a width of the attended spare underground cell is less than that of the attended open area, the attended spare underground cell can be inserted into the attended open area. In such case, the procedure proceeds to a step 109, otherwise, proceeds to a step 111.

In a renewal of the attended open area 111, another attended spare underground cell and another attended open area within the specific block region are designated as new spare underground cell and new attended open area.

Then, whether all of the open areas within the specific block region are checked 113. When one of the open areas is not checked, then the procedure returns to the step 107, otherwise, proceeds to a step 115.

In a renewal of the block region 115, another block region is designated as new block region.

Next, whether all of the block region are checked 117. When one of the block regions is not checked, then the procedure returns to the step 107, otherwise, proceeds to a step 119.

In a flag set step 119, a flag is set to the spare underground cell that cannot be inserted into the open area. Therefore, the flag shows that no more spare underground cell is inserted into the block divisions.

Then, it is determined whether the flags are set to all of the spare underground cells 121. If the flags are set to all of the spare underground cells, the procedure is finished 123.

Otherwise, no flag set spare underground cell is designated as new spare underground cell 125 and the procedure is returned to the step 107.

When the attended spare underground cell can be inserted into the attended open area, such insertion is conducted 109. From the attended open area, the inserted spare underground cell is deleted. A number of the spare underground cells within a spare underground cell list is decreased.

Then, a number of the inserted the spare underground cells is checked 127. If the number of the inserted the spare underground cells is not reached to the number of the list, the procedure is returned to the step 107.

Otherwise, another spare underground cell is designated as new spare underground cell 129 and the procedure is returned to the step 107.

As explained above, the spare underground cells are inserted in the open areas after logic cells are disposed within the pattern layout. Therefore, spare underground cells are automatically inserted into the open areas as much as possible without any effect of a size of the pattern layout. That is, an insertion of the spare underground cells are possible without any large scale circuit layout change.

Further, the pattern layout is divided into the block regions. Each of the block regions has spare underground cells. Therefore, a circuit layout change has occurred after the mask layout was finished, a single conductive layer should be changed for the total pattern layout.

Now, a second embodiment of the present invention will be described with reference to FIGS. 7-10.

Figure 7:
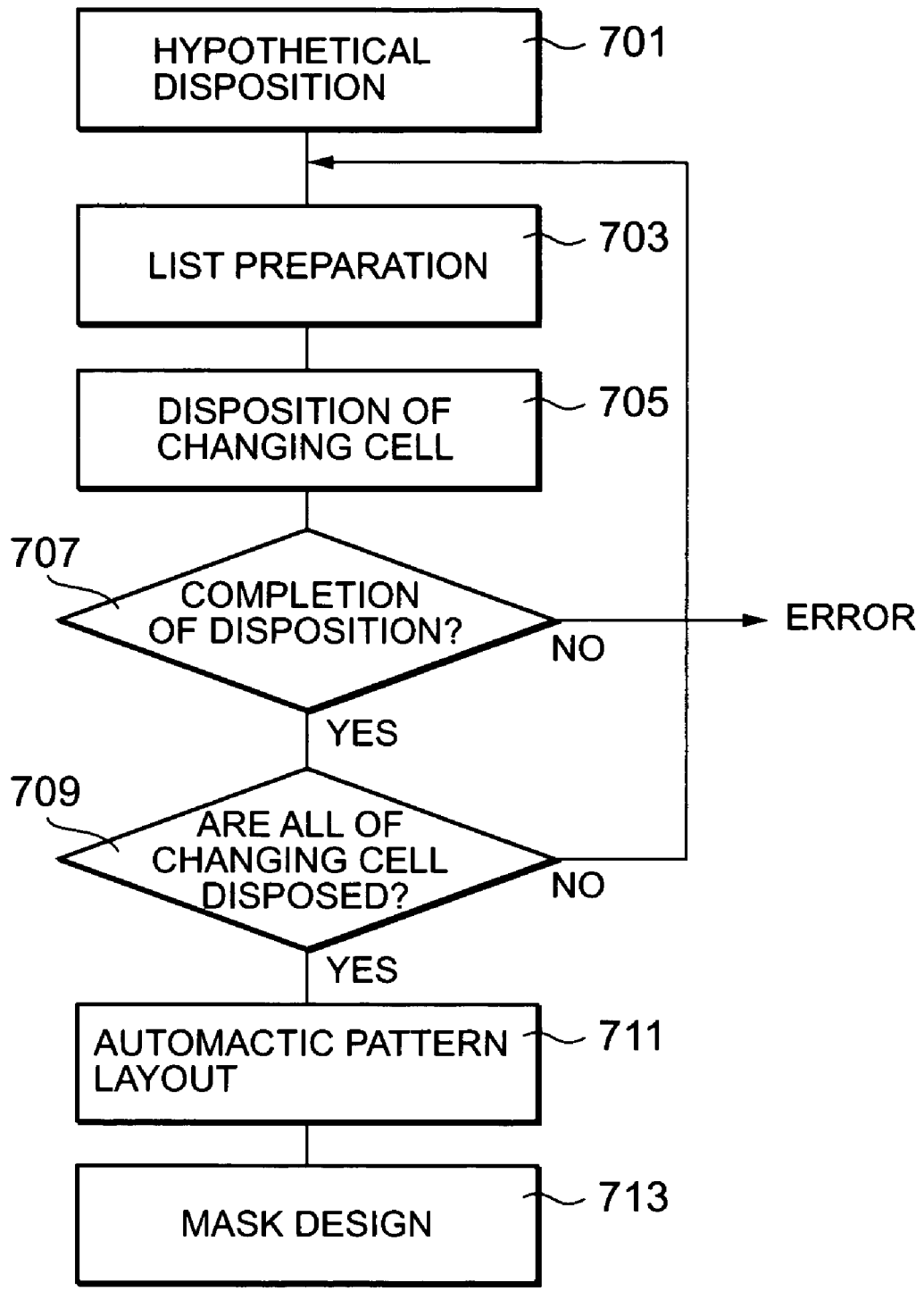
FIG. 7 is a flow chart showing a procedure for changing a circuit design of the LSI in the LSI design process.

FIG. 7 is a flow chart showing a procedure of the second embodiment of the present invention for changing a circuit design of the LSI in the LSI design process.

Figure 8:
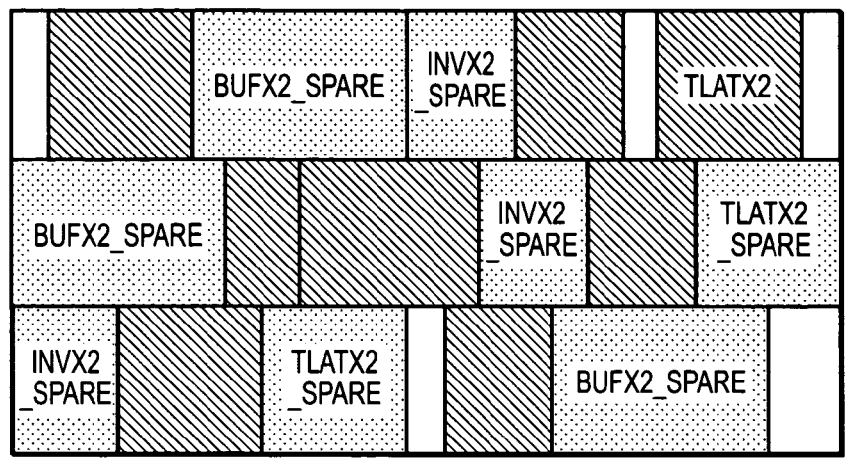
FIG. 8 shows an example layout pattern.

First, a hypothetical disposition 701 shown in FIG. 7 is explained. An intended circuit layout for changing a circuit design is provided as shown in FIG. 8. FIG. 8 is an example layout pattern of the second embodiment of the present invention. In FIG. 8, the dark pattern areas show the functional circuit cells. The functional cell TLATX2 is located in the right upper side. The light pattern areas show the underground spare cells. Each of the spare underground cells is designated as INVX2_SPARE, BUFX2_SPARE and TLATX2_SPARE.

Figure 9:
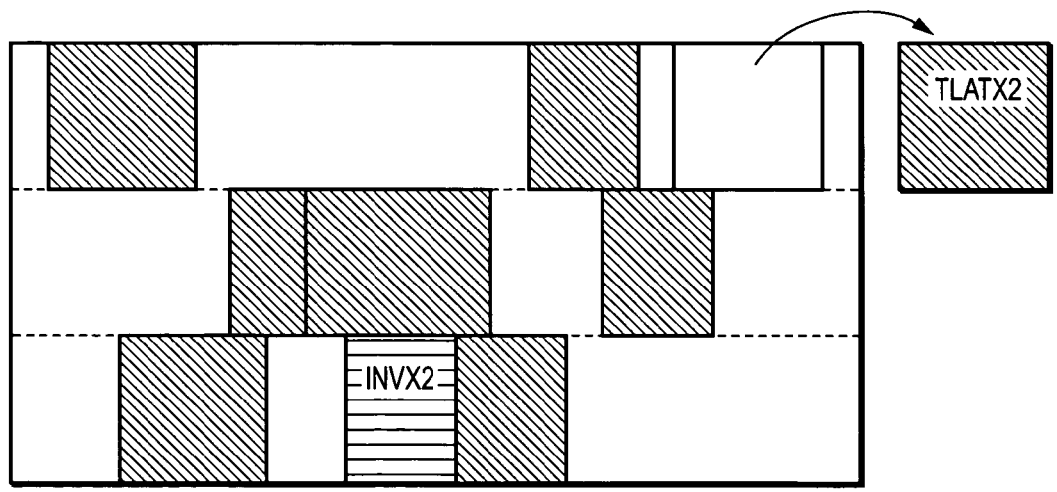
FIG. 9 shows a new layout pattern.

Then, all of the underground spare cells and the functional cell TLATX2 is removed from the circuit layout. The remaining circuit layout is stored as new net list. Next, an additional cell INVX2 is inserted in the new circuit layout as shown in FIG. 9. In this addition, all of the disposed cells are kept in the previous position. Further, the additional cell INVX2 is disposed in the best position for the automatic pattern layout.

Next, a changed cell list for changed circuit layout is prepared (703). In this step, the new net list for changed circuit layout and the net list for unchanged circuit layout is compared. From the comparison, a list of cells (circuit layout changing cell list) including an additional cell and a changed cell is prepared.

Then, the disposition for the changing cell is fixed (705). In the hypothetical disposition 701, the changing cell is temporally disposed. However, when the circuit layout change is conducted by changing the conductive pattern layer, the temporal disposition can not be used. Therefore, a spare underground cell for an intended changing cell is selected. In this selection, the nearest spare underground cell from the temporally disposed intended changing cell is selected. Then, the intended changing cell is removed and the nearest spare underground cell is provided for the intended changing cell. The pattern of the conductive pattern layer of the nearest spare underground cell is prepared so as to have a function of the intended changing cell. The removed cell is replaced with a spare underground cell having equal function of the nearest spare underground cell.

In the next step 707, a completion of the disposition for the nearest spare underground cell is confirmed. If the disposition is not conducted, the circuit layout is in error (NO).

If the disposition is conducted (YES in the step 707), then, it is checked whether all of changing cells are replaced (709). If the changing cell is remained (NO), the remaining changing cell becomes the intended changing cell and the procedure is returned to the step 705.

When all of the changing cells are replaced with the spare underground cells (YES in the step 709), an automatic pattern layout is conducted (711).

Finally, a mask is designed (713) for manufacturing a semiconductor integrated device.

As explained above, the circuit layout change is conducted by a pattern change of the conductive pattern layer with replacing cells only in the second embodiment. Further, an additional cell or a replaced cell are utilized from underground spare cells having the nearest position at which an automatic layout tool is positioned when the circuit layout change is conducted. Therefore, a length of the conductive pattern is reduced and an efficiency of a layout is improved. Furthermore, since a deleted cell is replaced with an underground spare cell having the same function, the circuit layout change can be conducted by changing a conductive pattern layout. The deleted cell can be utilized for the underground spare cell.

What is claimed is:

1. A computer-implemented method of designing a circuit layout of a semiconductor integrated circuit, the method being embodied in a data processing apparatus having at least an arithmetic processor and memory, the method comprising:
designing a logic function of the integrated circuit;
designing a pattern layout of the integrated circuit so that the pattern layout includes a logic cell area and an open area;
providing a spare underground cell having no interconnect patterns and contacts;
inserting said spare underground cell into the open area, wherein the spare underground cell includes a functional element;
designing a mask layout of the integrated circuit, the mask layout including the logic cell and the spare underground cell;
wherein the inserting the spare underground cell into the distributed open area comprises:
pointing out an open area in an attended block region and an attended spare underground cell;
inserting the attended spare underground cell into the open area in the attended block region;
renewing the attended block region; and
setting a flag when all inserting within the attended block region are finished; and storing the mask layout in the data processing apparatus memory.

2. The method of designing the circuit layout according to claim 1, wherein the functional element comprises a D flip-flop, an inverter, a NOR circuit, and NAND circuit, an exclusive OR circuit and a latch circuit.

3. The method of designing the circuit layout according to claim 1, wherein inserting the spare underground cell comprises:
dividing the pattern layout into a plurality of block regions;
searching the open area from the block regions;
distributing the open area into the block regions; and
inserting the spare underground cell into the distributed open area.

4. The method of designing the circuit layout according to claim 1, wherein the inserting the spare underground cell into the distributed open area further comprises:
renewing the attended spare underground cell; and
repeating the pointing out, the inserting the attended spare underground cell with another open area in another attended block region and another attended spare underground cell until all of the block regions are finished.

5. A computer-implemented method of designing a circuit layout of a semiconductor integrated circuit, the method being embodied in a data processing apparatus having at least an arithmetic processor and memory, the method comprising:
designing a logic function of the integrated circuit;
designing a pattern layout of the integrated circuit so as to include a plurality of logic cells in a logic cell area and an open area;
providing a plurality of spare underground cells having no interconnect patterns and contacts;
inserting said plurality of spare underground cells into the open area, wherein each of the spare underground cells includes a plurality of functional elements;
designing a mask layout of the integrated circuit, the mask layout including the logic cells and the spare underground cells,
wherein the inserting the spare underground cells into the distributed open area comprises:
pointing out an open area in an attended block region and an attended spare underground cell;
inserting the attended spare underground cell into the open area in the attended block region;
renewing the attended block region; and
setting a flag when all inserting within the attended block region are finished; and storing the mask layout in the data processing apparatus memory.

6. The method of designing the circuit layout according to claim 5, wherein the functional elements includes a D flip-flop, an inverter, a NOR circuit, a NAND circuit, an exclusive OR circuit and a latch circuit.

7. The method of designing the circuit layout according to claim 5, wherein each of the spare underground cells has a same kind of the functional elements.

8. The method of designing the circuit layout according to claim 5, wherein inserting the spare underground cells comprises:
dividing the pattern layout into a plurality of block regions;
searching the open area from the block regions;
distributing the open area into the block regions; and
inserting the spare underground cells into the distributed open area.

9. The method of designing the circuit layout according to claim 5, wherein the inserting the spare underground cells into the distributed open area further comprises:
renewing the attended spare underground cell; and
repeating the pointing out, the inserting the attended spare underground cell, renewing the attended block region, setting and renewing the attended spare underground cell with another open area in another attended block region and another attended spare underground cell until all of the block regions are finished.

* * * * *